United States Patent [19]

Danielmeyer et al.

[11] 4,124,524
[45] Nov. 7, 1978

[54] NEODYMIUM ULTRAPHOSPHATES AND PROCESS FOR THEIR PREPARATION

[75] Inventors: Hans-Günter Danielmeyer, Hofingen; Jean-Pierre Jeser; Walter W. Krühler, both of Stuttgart; Erich Schönherr, Warmbronn; Günter Huber, Gerlingen, all of Germany

[73] Assignee: Max-Planck-Gesellschaft zur Forderung der Wissenschaften e.V., Göttingen, Germany

[21] Appl. No.: 724,799

[22] Filed: Sep. 20, 1976

Related U.S. Application Data

[63] Continuation of Ser. No. 495,172, Aug. 6, 1974, abandoned.

[30] Foreign Application Priority Data

Aug. 21, 1973 [DE] Fed. Rep. of Germany ....... 2342182
Jan. 9, 1974 [DE] Fed. Rep. of Germany ....... 2400911
Jan. 26, 1974 [DE] Fed. Rep. of Germany ....... 2414513

[51] Int. Cl.² .............................................. H01S 3/16
[52] U.S. Cl. ...................... 252/301.1 R; 252/301.4 P; 331/94.5 F; 423/305
[58] Field of Search ....................... 423/253, 305, 306; 252/301.1 R, 301.4 P; 331/94.5 F

[56] References Cited

U.S. PATENT DOCUMENTS 3,813,613  5/1974  Danielmeyer et al. ......... 331/94.5 F
3,863,177  1/1975  Damen et al. .................... 331/94.5 F

OTHER PUBLICATIONS

Hawley, G., The Condensed Chemical Dictionary, 8th Edition, Van Nostrand Reinhold Co., N.Y., 1971, p. 775 "Scandium".

Primary Examiner—Benjamin R. Padgett
Assistant Examiner—Deborah L. Kyle
Attorney, Agent, or Firm—Burgess, Dinklage & Sprung

[57] ABSTRACT

Neodymium ultraphosphates having the formula $$Me_xNd_{1-x}P_5O_{14}$$

wherein Me represents scandium, gallium, yttrium, indium, lanthanum, cerium, gadolinium, lutetium, thallium and/or uranium, and $x$ is a number between 0 and 0.999, in the form of untwinned crystals, are prepared by heating $Nd_2O_3$ and $Me_2O_3$ in a vessel consisting of fine gold or of an inert, dense, carbon-based material with an excess of high-purity, anhydrous phosphoric acid or diphosphoric or polyphosphoric acid at a temperature between about 500° and 600° C, until the desired crystal size is achieved and then separating excess phosphoric acid or polyphosphoric acid, as the case may be.

13 Claims, 3 Drawing Figures

NEODYMIUM ULTRAPHOSPHATES AND PROCESS FOR THEIR PREPARATION

This is a continuation of application Ser. No. 495,172, filed Aug, 6, 1974, now abandoned

BACKGROUND

The invention relates to improved neodymium ultraphosphates which can be used especially as solid laser materials, but for other purposes as well, and to a method of manufacturing same.

Neodymium-doped crystals, such as yttrium-aluminum-garnets (YAG) or yttrium-aluminum oxide (YAlO) and neodymium-doped glasses constitute good solid laser materials, as it is known: in these materials the energy levels of the trivalent neodymium ion which are required for laser operation are rather good, both in regard to pumping conditions (absorption bands in the visible and near-infrared range) and in regard to emission (so-called four-level operation is possible). The most important emission lines are relatively sharp, the best known line being at a wavelength of 1.06 $\mu$m. The laser-active neodymium ions do not display any aging or decomposition phenomena. Furthermore, the above-mentioned crystalline materials have a good thermal conductivity (important for lasers of high sustained output) and the glasses can be produced economically in large pieces (important in lasers of high pulse energies).

Nevertheless, these known laser materials have one disadvantage which has lead to a search for still better materials.

For optical communication, optical transmitters and optical amplifiers are needed which can be miniaturized, i.e., laser materials are needed which have a high optical amplification even when their dimensions are very small. Semiconductor lasers and neodymium lasers, basically, come under consideration for this purpose.

In a fundamental scientific paper (H. G. Danielmeyer, M. Blätte and P. Balmer, Appl. Phys. 2, 269-274, 1973) it has been shown that the Nd:YAG neodymium laser, which has hitherto been the best, is not suitable for miniaturization because the neodymium concentration cannot be made sufficiently great. It has been found that, if the Nd concentration is increased to more than a few percent, the fluorescent lifetime of the ions decreases greatly for fundamental reasons, so that the required pumping energy increases in an undesirable manner.

NdP$_5$O$_{14}$ (neodymium ultraphosphate) is the first laser material that has been produced, not by doping, but as a genuine chemical compound, and which can produce and amplify laser radiation, even continuously, at room temperature, with a high degree of efficiency. By x-ray studies it has been found that NdP$_5$O$_{14}$ is monoclinic and has a twinning tendency. This latter characteristic, however, is a decided disadvantage as regards the optical quality of the crystal. Furthermore, the duration of the upper laser state ($^4$F$_{3/2}$, of 66 microseconds, is relatively short and the line width of the principle laser transition at 1.05 $\mu$m, which is 50 Å, is relatively great, so that the laser threshold is relatively high.

It is the object of the invention, therefore, to overcome the disadvantages of neodymium ultraphosphate and to create an improved material which will have a longer life, will reduce the line width and increase the laser efficiency, and which will have no twinning tendency or will have it to a reduced degree. Another object of the invention is to eliminate the quality variations which have hitherto occurred in neodymium ultraphosphate from different production batches. In the hitherto known process of the manufacture of NdUp crystals, the shape and size has been quite different in repeated growth experiments, although the conditions were kept constant insofar as possible. Also, variations in regard to fluorescent lifetime are to be eliminated and the size of the grown crystals is to be increased.

This purpose is achieved in accordance with the invention by a process for preparing compounds of the general formula

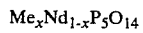

$$Me_xNd_{1-x}P_5O_{14}$$

in which Me represents scandium, gallium, yttrium, indium, lanthanum, cerium, gadolinium, lutetium, thallium and/or uranium, and $x$ is a number between 0 and 0.999, in the form of untwinned crystals, which is characterized by the fact that Nd$_2$O$_3$ and Me$_2$O$_3$ are heated in a vessel consisting of fine gold or an inert, dense, carbon-base material with an excess of high-purity, anhydrous phosphoric acid or diphosphoric or polyphosphoric acid at a temperature between about 500° and 600° C., until the desired crystal size is achieved, and then the excess phosphoric acid or polyphosphoric acid is separated.

The starting substances Nd$_2$O$_3$ and in some cases Me$_2$O$_3$ must be used in a high purity, preferably of 99.999% and more. This puirty is necessary because even traces of other elements, particularly praseodymium, samarium and dysprosium, suppress the neodymium radiation. The specified vessel material is necessary because hot polyphosphoric acid dissolves everything except gold and certain carbonbase materials. Platinum vessels are especially unsuitable because platinum forms a compound with pyrophosphoric acid.

Glass-like carbons, boron carbide, silicon carbide and diamond have proven especially suitable as vessel materials. They enable the fluorescent lifetime to be increased by a factor of 1.5 over gold vessels, because gold dissolves in small amounts in the phosphoric acid.

The phosphoric acid must, as previously mentioned, be used in an excess above the stoichiometrically necessary amount. Preferably, a ratio of all of the metal oxides to phosphoric acid between 1 : 30 and 1 : 50, by weight, is used. Larger amounts of phosphoric acid produce no advantage, and when amounts less than the stated range are used, the crystal size obtainable is smaller and the crystal quality poorer.

The phosphoric acid can be either anhydrous or it may still have a moisture content within the scope of the invention. If phosphoric acid containing water is used, it is first heated to a relatively moderately elevated temperature until no more free water is present. Typical conditions for this purpose are 10 hours of heating at about 180° to 220° C. The end of the moisture removal phase can be recognized by the fact that the oxides added begin to dissolve. During removal of the moisture it is desirable to keep the acid under a flowing shield of inert gas to carry away the water that is released. Suitable inert gases are those which are inert to the substances used and to water, such as for example nitrogen, oxygen and noble gases. When the moisture removal is complete the heating in the sealed chamber is continued. The dehydrating phase can be shortened or entirely eliminated if anhydrous phosphoric acid or diphosphoric acid ($H_4P_2O_7$) or pyrophosphoric acid is used. The oxides of the above-mentioned rare earths also go completely into solution in diphosphoric acid.

Heavy phosphoric acid ($D_3PO_4$) or heavy diphosphoric or polyphosphoric acid may also serve as the phosphoric acid in the invention, and the deuterium may be wholly or partially replaced by tritium. When $x$ in the above formula represents, 0, a deuteriated or tritiated phosphoric acid of this sort must be used to enable the desired characteristics of the crystals to be achieved.

Surprisingly it has been found that, through this embodiment of the process of the invention the fluorescent life of the neodymium ultraphosphate crystals can be substantially increased. This results in a correspondingly lower pumping threshold for use as laser material, or in an improved efficiency. The reason for this is not known, but it is assumed that, when the neodymium ultraphosphate is prepared in normal phosphoric acid, lattice flaws are formed to a very small extent, in which neodymium is replaced by three hydrogen ions. Since hydrogen ions to a great degree quench the excitation energy of neodymium ions, the maximum possible fluorescent life of neodymium ultraphosphate crystals cannot be achieved when they are grown in normal phosphoric acid or in diphosphoric or polyphosphoric acid. It is assumed that, by this preferred procedure, such flaws are occupied by the far heavier deuterium or tritium which, on account of its doubled or tripled mass, cause no quenching or substantially less quenching of the excitation energy. Another special effect which occurs in the use of tritiated phosphoric acid is that the tritium, with a half life of 12 years, is converted to helium and the crystals become entirely free of easy quenching centers. As a result, noedymium ultraphosphate crystals pulled in phosphoric acid containing tritium improve their lasing characteristics in the course of time.

The surprising effect occurs even when, instead of the normal neodymium ultraphosphate crystals of the formula $NdP_5O_{14}$, the doped neodymium ultraphosphates of the general formula $$Me_xNd_{1-x}P_5O_{14}$$

are produced, wherein Me represents scandium, gallium, yttrium, indium, lanthanum, cerium, gadolinium, lutetium, thallium and/or uranium, and $x$ represents a number between 0.001 and 0.999. In this case only a portion of the $Nd_2O_3$ used as starting material is replaced by $Me_2O_3$.

Phosphoric acid containing heavy water or already freed thereof can be used as heavy or tritiated phosphoric acid (hereinafter called simply phosphoric acid) within the scope of the process of the invention. The statements made above concerning ordinary phosphoric acid apply here accordingly.

The actual crystal growing takes place between about 500 and about 600° C., preferably between 540° and 560° C. At growing temperatures above 600° C. and below 500° C., the crystal quality diminishes importantly. During crystallization, low-polymeric components of polyphosphoric acid escape, as well as water, which here again is to be understood to include heavy water and tritium oxide, and they condense in the colder part of the closed crystallization system. The growth rate of the crystals can be controlled by regulating the temperature of the condensate. This makes it possible in a simple manner to adjust the water vapor partial pressure in the system, which determines the degree of polymerization of the phosphoric acid. In accordance with a special embodiment of the process of the invention, therefore, the polymerization can be controlled by regulating the water vapor partial pressure. As the water vapor partial pressure increases the crystals redissolve; as it diminishes they resume growing. Particularly good results are obtained when the condensate is kept at room temperature.

By recycling the low-polymeric phosphoric acid condensed in the colder zone, the process of the invention can be made into a continuous recrystallization process in which particularly large crystals are obtained.

The growth rate of the crystals can be controlled not only by the above-mentioned preferred embodiment using control of the temperature of the condensate, but also by producing a temperature gradient in the solution, for example by cooling one side of the gold vessel.

After the crystallization is completed, which in the above-described, preferred embodiment takes about 4 to 8 days, residual polyphosphoric acid can be poured while hot through a gold sieve. Adhering phosphoric acid traces are then removed from the crystals by vacuum evaporation or by passing over them an inert gas saturated with water vapor at room temperature.

The cleaning by means of moist inert gas takes place relatively rapidly at about 500° to 600° C. It is therefore possible to completely eliminate the pouring off of the remaining phosphoric acid and to remove all of the excess phosphoric or polyphosphoric acid completely at the growth temperature. For example, the phosphoric acid can be removed entirely at 550° C. in the growth vessel within one day by passing through it argon which has been saturated at room temperature with water vapor.

The water vapor reduces the degree of polymerization and thus the boiling point of the polyphosphoric acid, which therefore evaporates faster and is carried off by the carrier gas. Any inert gas may be used as the carrier gas. Then a very slow and gentle cooling of the crystals can be performed, for example from 550° C. to room temperature over a period of 5 hours. It is also possible to wash the phosphoric acid out with distilled water, but in this case there is the danger that the crystal faces may be dissolved away or the crystals may crack or craze due to thermal shock.

Additional subject matter of the invention is compounds of the general formula $$Me_xNd_{1-x}P_5O_{14}$$

in which Me represents scandium, gallium, yttrium, indium, lanthanum, cerium, gadolinium, lutetium, thallium and/or uranium, and $x$ represents a number between about 0.001 and 0.999. The compounds of the invention are in monoclinic crystals or in amorphous, glassy form. The compounds of the invention can contain one of the above-named metals or a mixture of same. They have the characteristic of not quenching the neodymium fluorescence. Values between 0.02 and 0.95 are preferred for $x$, but a substantial improvement of the laser characteristics is achieved even when the additives are incorporated in a non-detectable amount, that is, when their presence can be detected only in the growth solution.

Furthermore, neodymium ultraphosphates which have been obtained with heavy or tritiated phosphoric or diphosphoric or polyphosphoric acid by the method described above are additional subject matter of the invention.

The compounds of the invention can be obtained not only in crystallized form but also in glassy form. The transformation can be brought about by heating crystals in a sealed crucible of appropriate material to a temperature of 900° to 1500° C., at an external shielding gas pressure between 1 and 100 atmospheres. By slow cooling a material is obtained which has solidified mostly in glassy form. It is desirable to subject the vessel to an external pressure corresponding approximately to the rising internal pressure, since the noble metal crucibles are not very strong mechanically. In the glassy state the life time of the upper laser state of the compounds of the invention is considerably shorter, but on the other hand pieces of any desired size can be produced in this manner, which is not possible with crystals. The life time of the upper laser state in the glass amounts to approximately 20 microseconds. On account of their high optical quality and the possibility of giving them any desired shape, such glasses are particularly well suited as laser substances and are greatly desirable for many purposes in spite of their reduced life time.

To further explain the process of the invention, reference is made to the appended drawing, wherein FIG. 1 is a cross sectional view of a laboratory apparatus which is suitable for the performance of the preferred embodiment of the crystal growing process of the invention;

Figure 1:
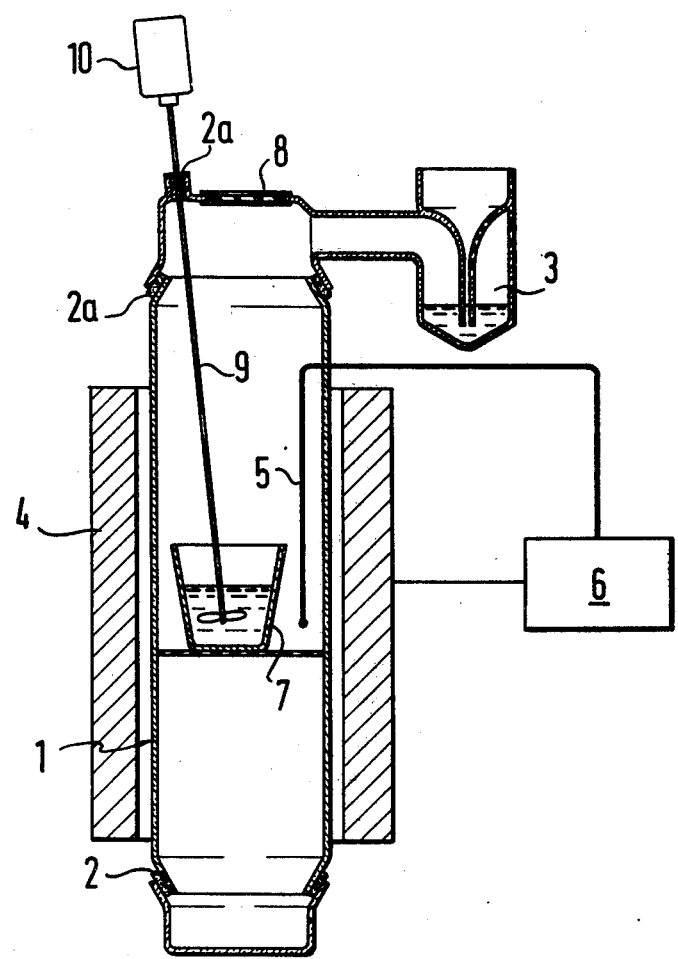

A preferred crystal growing arrangement shown in FIG. 1 consists of a quartz glass vessel 1 with a removable bottom which is attached with a teflon seal 2. Above a teflon seal 2a there is attached a sidearm having an enlarged portion serving as a cold zone 3 for the condensate.

Quartz glass vessel 1 is within a furnace. A Pt-PRh thermocouple 5 controls the furnace temperature through a temperature control 6. In the heating portion of the quartz glass vessel 1, surrounded by the furnace 4, there is the crystal growing vessel 7 made of fine gold. An observation window 8 in the cover of the quartz glass vessel permits observation of the content of the vessel. A stirrer 9, which is driven by a stirrer motor 10, keeps the contents of the crucible slowly in movement.

Figure 2:
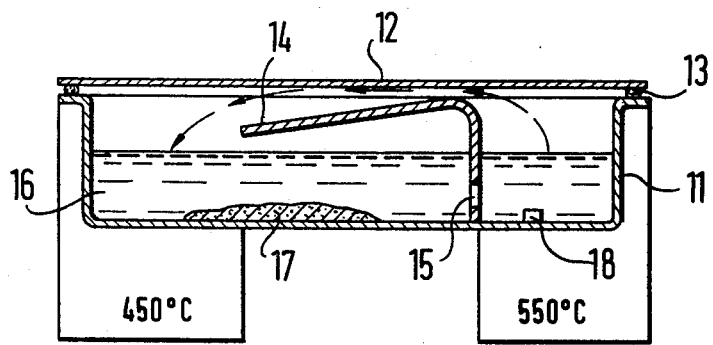
FIG. 2 is a cross sectional view of an apparatus for the recrystallization of ultraphosphate crystals on a laboratory scale.

The recrystallization apparatus shown in FIG. 2 consists of a closed gold vessel 11 having dimensions of 6 × 1.5 × 2.0 cm. A lid 12 seals the vessel through a sealing ring 13 made of 90 Au 10 Pt alloy. The vessel is divided by a partition 14 that is open at the top, into a right heating area, which is kept for example at 550° C., and a cooler zone on the left thereof, which is kept for example at 450° C. In the partition 14 there is an exchange aperture 15 of about 1 mm diameter. Polyphosphoric acid 16 is in the vessel. In the left portion of vessel 11, which is held at lower temperature, there are the supply crystals 17 which are to be dissolved, and in the right part of the vessel, which is held at the higher temperature, new crystals 18 are formed by recrystallization. In operation, a portion of the phosphoric acid evaporates in the right, hotter portion of the vessel and passes over partition 14 into the left, cooler portion, where it condenses.

The compounds of the invention, especially those grown from the solution, are not twinned and they show an abrupt increase in the lifetime of the upper laser state.

An additional advantage of the compounds of the invention consists in the fact that they have a narrower main laser transition line width. They furthermore have a higher output of fluorescence and, lastly, as crystals they are larger than the $NdP_5O_{14}$ crystals which have been known hitherto. They are thus in virtually all ways substantially superior as a laser substance to the $NdP_5O_{14}$ material that has heretofore been the most suitable. In addition, they are suitable as converters for changing the wavelength of light, both as "downconverters" for converting light of shorter wavelength to light of longer wavelength (like lasers, but incoherent) and, vice versa, as "upconverters," and also as Faraday rotators, i.e., for changing the direction of polarization of light as it passes through the compound in a magnetic field.

EXAMPLES

EXAMPLES 1 to 5

$Nd_2O_3$ and $Y_2O_3$ were weighed into a gold vessel in the ratios given in the following table, and used together with 20 g of $H_3PO_4$ for growing crystals at 550° C. in an apparatus in accordance with FIG. 1. The crystal growth time amounted to 1 week, the cold zone of the growing vessel being kept at room temperature. The actual crystal growth was preceded by a dehydration phase of 10 hours at 200° C. The following table shows the duration of the excited upper laser state determined in microseconds with the crystals obtained. The excitation of fluorescence was performed with a Zeiss dye laser.

Table

| Example | Nd:Y ratio | x | Amount weighed in, mg $Nd_2O_3$ | mg $Y_2O_3$ | Duration in microseconds |
|---|---|---|---|---|---|
| 1 | 1:0 | 0 | 400 | 0 | 66 |
| 2 | 30:1 | 0.03 | 336 | 9 | 130 |
| 3 | 1:1 | 0.5 | 336 | 226 | 200 |
| 4 | 2:3 | 0.66 | 200 | 200 | 230 |
| 5 | 1:10 | 0.9 | 63 | 423 | 230 |

It can be seen that the addition even of a small amount of $Y_2O_3$ results in an abrupt increase of the duration by about 100%. At the same time the tendency toward twinning is decisively abolished. Optimum characteristics are obtained by the admixture of yttrium when x is between 0.1 and 0.5.

The above-described experiments were repeated with the other Me metals listed. In general, an increase in the duration of the fluorescence was again observed, although in the case of gadolinium and thallium, for example, there was no chemically detectable amount in the crystal.

Figure 3:
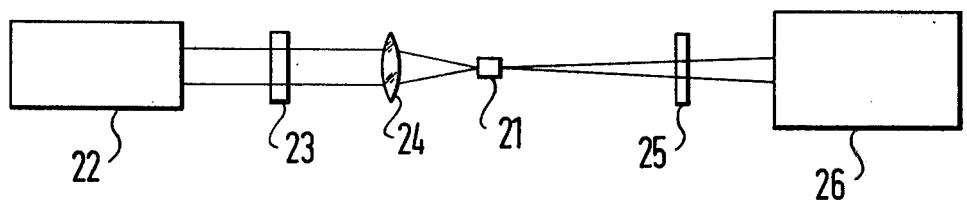
FIG. 3 is a diagrammatic representation of an arrangement for the detection of the laser radiation of the compounds of the invention.

A laser crystal in accordance with Example 2, having a length of 1.3 mm was excited in a very simple manner with the arrangement shown in FIG. 3 to superradiation at 1.05 μ wavelength. For this purpose the laser crystal 21 was irradiated by a tunable Zeiss dye pumping laser 22 with a pumping beam of 5800 Å through a KG3 filter 23 and a focusing lens 24 having a focal length of 10 mm. In this manner a neodymium superradiation of 10,515 Å with a beam divergence of 1° was produced, which was directed through an RG715 filter 25 to the detecting appartus 26 consisting of a semiconductor diode (time), a spectrometer (spectral performance) and an infrared phosphor (beam divergence). The line width of the laser radiation of the crystal was less than 0.1 Å upon excitation of an axial mode, and 4 Å maximum.

EXAMPLE 6

1 g of $Nd_2O_3$ was weighed into a gold vessel and used together with 20 g of $D_3PO_4$ for crystal growing at 550° C. in an apparatus consisting of a closed quartz glass vessel having a sidearm serving as the cold zone. The apparatus was maintained for 1 week at 550° C., and the sidearm of the growing vessel was cooled to room temperature. The actual crystal growing was preceded by a dehydration phase of 10 hours at 200° C.

The neodymium ultraphosphate crystals obtained had a fluorescence life of 100 to 200 microseconds.

The process was repeated using $H_3PO_4$ instead of $D_3PO_4$. The neodymium ultraphosphate crystals obtained has a fluorescence life of only 66 microseconds.

EXAMPLE 7

1 g of $Nd_2O_3$ was weighed into a vessel of glassy carbon and used together with 20 g of $D_3PO_4$ for crystal growing at 550° C. in an apparatus consisting of a closed quartz glass vessel with a sidearm serving as a cold zone. The apparatus was maintained for 1 week at 550° C., while the sidearm of the growing vessel was cooled to room temperature. The actual crystal growing was preceded by a dehydration phase of 10 hours at 200° C.

The neodymium ultraphosphate crystals obtained had a fluorescence life of 100 to 200 microseconds.

These lifetime values are the maximum possible for the neodymium ions, because the heavy and superheavy phosphoric acid reduces the concentration of hydrogen flaws, the use of glassy carbon as crucible material eliminates gold as quenching centers, and the addition of one of the listed metals prevents twinning.

Thus it is not especially necessary to grow the $NdP_5O_{14}$ with metal additives or to obtain it from heavy or tritiated phosphoric acid. Merely by the replacement of the fine gold crucible with a vessel of the preferred carbon base material it has been possible to increase the fluorescence life of and $NdP_5O_{14}$ crystal prepared with normal phosphoric acid from 66 microseconds to 95 microseconds.

We claim:

1. Process for the preparation of compounds having the formula $$Me_xNd_{1-x}P_5O_{14}$$

in the form of untwinned crystals wherein Me represents scandium, gallium, yttrium, indium, lanthanum, cerium, gadolinium lutetium, thallium and/or uranium, and $x$ is a number between 0 and 0.999, which comprises heating $Nd_2O_3$ and $Me_2O_3$ in a vessel consisting of fine gold or of an inert, dense, carbon-base material in a closed system having a zone which is held at a lower temperature with an excess of high-purity, anhydrous normal or heavy phosphoric acid or diphosphoric or polyphosphoric acid, the deuterium being able to be wholly or partially replaced by tritium, with the proviso that a deuteriated or tritiated acid must be used if $x \times 0$, at a temperature between about 500 and 600° C., regulating the crystal growth by regulating the vapor pressure during crystal growth until the desired crystal size is achieved and then separating excess phosphoric acid or polyphosphoric acid, as the case may be.

2. Process of claim 1 wherein the deuteriated or tritiated phosphoric acid is recovered.

3. Process of claim 1 wherein after completion of the crystallization, excess phosphoric acid or polyphosphoric acid is removed by distillation by means of inert gas in the presence of water vapor.

4. Process of claim 1 wherein excess phosphoric acid is removed by vacuum evaporation.

5. Process of claim 1 wherein the crystals are grown at a temperature between 540° and 560° C.

6. Process of claim 1 wherein said vessel consists of glassy carbon, boron carbide, silicon carbide or diamond.

7. Process of claim 1 wherein said vessel consists of glass-like carbon.

8. The product produced by the process of claim 1 wherein $x$ is 0.

9. Compounds of the general formula $Me_xND_{1-x}P_5O_{14}$ wherein Me is selected from the group consisting of scandium, gallium, inidium, thallium or mixtures thereof, and $x$ is a number between 0.001 and 0.999.

10. Compounds of claim 9 in the form of untwinned crystals.

11. Process for the preparation of a compound of claim 9 in amorphous glassy form which comprises heating a crystalline compound of claim 10 in a closed system at a temperature between 1100° and 1300° C.

12. Process of claim 11 wherein cooling of the amorphous compounds takes place slowly so that larger crystalline areas result.

13. Compounds of claim 9 in amorphous glassy form.

* * * * *

UNITED STATES PATENT AND TRADEMARK OFFICE
CERTIFICATE OF CORRECTION

PATENT NO. : 4,124,524
DATED : November 7, 1978
INVENTOR(S) : DANIELMEYER et al.

It is certified that error appears in the above-identified patent and that said Letters Patent are hereby corrected as shown below:

[30] Title Page, Priority, "Jan. 26." should read -- March 26. --.

Column 2, line 47, "1:30" should read -- 1:20 --.

Column 3, line 39, "The" should read -- This --.

Column 5, line 45, "PT-PRH" should read -- PT-PTRH --.

Column 7, line 47, "and" should read -- an --.

Column 8, line 16, Claim 1, "xo" should read -- = 0 --.

Signed and Sealed this

Tenth Day of April 1979

[SEAL]

Attest:

RUTH C. MASON
Attesting Officer

DONALD W. BANNER
Commissioner of Patents and Trademarks